TIPPED COMPONENT LEAD FOR PRINTED CIRCUIT BOARDS

Filed June 13, 1958

2 Sheets-Sheet 1

INVENTORS
ROBERT ULLMAN
BY ROBERT J. KINKAID

Curtis, Morris & Safford

INVENTORS
ROBERT ULLMAN
BY ROBERT J. KINKAID
Curtis, Morris & Safford

United States Patent Office 3,076,164
Patented Jan. 29, 1963

3,076,164
TIPPED COMPONENT LEAD FOR PRINTED CIRCUIT BOARDS

Robert Ullman, Harrisburg, and Robert J. Kinkaid, New Cumberland, Pa., assignors to AMP Incorporated, Harrisburg, Pa.

Filed June 13, 1958, Ser. No. 741,832
4 Claims. (Cl. 339—17)

This invention relates in general to electrical connections, more particularly to the means of coupling a wire conductor, such as a component lead, to the conductive strips of a printed circuit board.

In the fixture of circuit components to a printed circuit board in the formation of electronic assemblies, the common practice is to clinch the component leads to the board through suitably arranged apertures from which radiate the printed strips comprising the circuit interconnecting leads, or alternatively studs are inserted in the board apertures to which the component leads are subsequently connected, or an adapter ferrule or band wedgeable in the board apertures may be preapplied to the component leads, all to the end of mechanically supporting the various components on the board prior to the application of solder, as by dipping or floating the board in a bath of molten solder, for completing electrically the connection between the component leads and the printed circuit strips. Frequently the board may have printed circuit strips on both surfaces, in which event it heretofore has been found necessary to plate through or eyelet the board apertures to assure circuit continuity where required from printed strips on one side of the board to printed strips on the other side. In the solder-dip operation it is contemplated that by capillary action solder will flow up through the aperture to form a solder fillet in contact with the lead and the printed circuit strips. As the board aperture in whole or in part has been depended upon to provide the stimulus for the capillary flow of the solder, the aperture sidewalls must be wettable by solder. In short, as the usual plastic material used to form the base board is non-wettable by solder, the metallic coating of the aperture sidewalls by plating or eyeleting in addition to providing circuit continuity, is made necessary, which plating or eyeleting, compared to the printing of the board surfaces, is relatively troublesome, costly and preferably avoided.

It is therefore an object of the present invention to provide a lead tip formation dip-solderable to a printed circuit board without regard to the presence or absence of plating on the board aperture sidewalls. Other objectives are that the lead tip be of such configuration as to be susceptible to formation by cold-forging techniques as generally practiced in the art of crimping solderless connectors, and especially by crimping a metallic band or ferrule about the component lead end; that the lead tip thus formed be self-inducing to the capillary flow of solder upon insertion of the tip into a circuit board aperture and subjection of the board to a solder-dip operation; and that the solder flow thus induced be such as to form a continuous solder fillet connecting the lead and the printed circuit in a minimum time at relatively low solder bath temperatures substantially uniformly over a large number of connections—all of the foregoing being quite independent of whether an aperture in the circuit board is or is not capable itself of lifting or assisting in lifting molten solder by capillary action.

These objects, in general, are attained by tipping the end of a component lead with a metallic adapter member of uniform contour relative to a given size printed circuit board aperture regardless, over a predetermined range, of the lead diameter, the adapter contour being such as to provide stable frictional engagement of the tipped lead at a plurality of points with the sidewalls of the circuit board aperture, the adapter further having a contour providing preferably a plurality of longitudinal serrations or indentations between the points of frictional engagement to obtain a maximum self-induced flow of solder upon solder-dipping. With the tipped lead inserted in an aperture of a board having, for example, circuitry printed on both surfaces the longitudinal serrations or indentations may provide a plurality of capillary passages or solder wells, independent of the character of the board material, up which solder may rise ultimately to contact the printed circuit pad surrounding the aperture and form the desired continuous fillet around the component lead at the upper surface of the board. A fillet also formed around the component lead on the under, or dipped, surface of the board serves, with the component lead and upper surface fillet, achieves circuit continuity between the board surfaces.

Conveniently tipping of the component lead end in accordance with one aspect of the invention is accomplished by cold-forging or crimping about the lead a sheet metal adapter which is preformed to substantially U-shape in cross-section. The sheet metal forming the adapter may have pre-formed exterior longitudinal grooves or indentations, but preferably the crimping dies for applying the adapter have longitudinal indenting portions in the die faces thereof to form the desired capillary passages in the making of the crimp. In addition the die faces preferably converge to effect a crimp tapering toward the lead end to a forward dimension which is just sufficiently tight to crimp the component lead of least diameter in the accepted range and a rearward transverse dimension at least equal to the aperture diameter thereby to provide the desired wedging of the tipped lead in the printed circuit board.

Other objects and attainments of the present invention will become apparent to those skilled in the art upon a reading of the following detailed description when taken in conjunction with the drawings in which.

Figures 1, 2, 7:
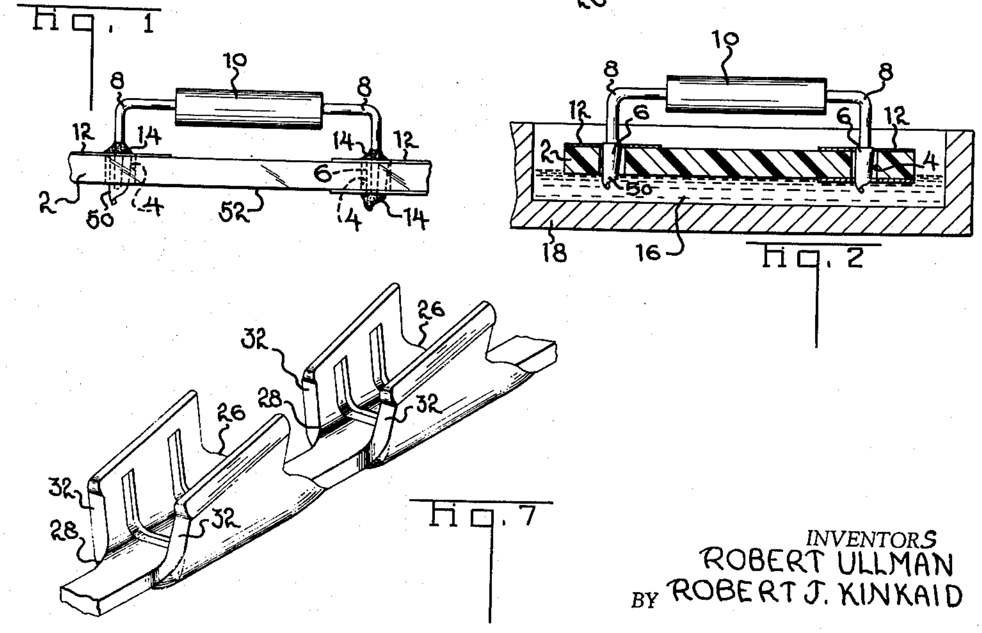
FIGURE 1 is a side view of a printed circuit board having an electrical component mounted thereon in accordance with principles of the present invention.
FIGURE 2 is a diagrammatic sectional side view of the printed circuit board shown in FIGURE 1 being dipped in a bath of molten solder.
FIGURE 7 is a perspective view of a series of adapter members in strip form prior to their application to component leads to produce tipped leads such as shown in FIGURES 3 and 4.

Referring now to FIGURES 1 and 2, base plate 2, of suitable non-conducting material, forms the base panel of a conventional printed circuit board having apertures 4 receiving the end portions 6 of the leads 8 of various electrical components, typified by resistor 10, which are electrically connected to the conductive paths 12 on either or both surfaces of plate 2 by solder fillets 14. In accordance with the present invention the lead end portion 6 is tipped with an adapter member, to be more particularly described, which provides stable mechanical support for lead 8 on base plate 2. Further the tipped lead has characteristics such that, on dipping the printed circuit board in molten solder 16 of solder bath apparatus 18, diagrammatically illustrated in FIGURE 2, solder will rise up through the apertures 4 by virtue of the capillary characteristics of the tipped lead alone and regardless of any plating or lack of plating on the apertures' sidewalls, ultimately to contact printed circuit pad 20 (FIGURE 5) surrounding aperture 4 to form the desired solid continuous fillet 14. It is to be understood that, according to the design of the electronic circuit and the arrangement thereof in the printed pattern, any number of printed conductive paths may terminate at a given aperture for connection to the associated component lead and may be found on either or both sides of base plate 2, fillets 14 being formed on either or both sides of base plate 2 according to the presence or absence of printed pads 20.

FIGURES 3 through 6 illustrate details of construction one form of the tipped lead end 6, in accordance with the present invention, may take. As shown, end segment 22 of lead 8 has wrapped or formed thereon an adapter member 24 of sheet metal, such as tin-plated brass, the whole forming a composite structure generally of rectangular configuration, the main body of which tapers from its leading end 26 to trailing or rearward end 28 from a maximum lateral dimension significantly less than the diameter of aperture 4 to a maximum lateral dimension slightly larger than the aperture diameter. As thus constructed, it will be apparent that on insertion of the composite structure into a board aperture, a wedging action will be effected providing mechanical support for component 10 and lead 8 on the board, and mechanical stability to the tipped lead 6 in aperture 4 prior to solder dipping of the printed circuit assembly. By virtue of the tapered construction the wedge fit will be obtained regardless of dimensional variations within the predetermined design tolerance ranges. To facilitate insertion of the composite structure into the circuit board apertures, as by automatic insertion machines now common in the art, adapter 24 preferably is provided with a tapered forward extension 30.

As alluded to above, to achieve the desired continuous solder fillet connecting lead end 22 to printed circuit pad 20 by the solder-dip method where the sidewalls of apertures 4 are unplated and are not wetted by molten solder, the peripheral contour of adapter 24 preferably is formed with sharply reentrant corners and grooves to provide approximations of capillary tubes spaced around the tipped lead periphery whereby to achieve a capillary rise of solder of a high volume rate of flow. In the embodiment of the present invention illustrated in FIGURES 3 to 6, these ends are attained under the further condition that the adapter be applied utilizing the technique of cold-forging or crimping a partially pre-formed ferrule to a wire, well-known in the art of making solderless connections as will be explained in connection with FIGURES 7 to 10.

Figure 5:
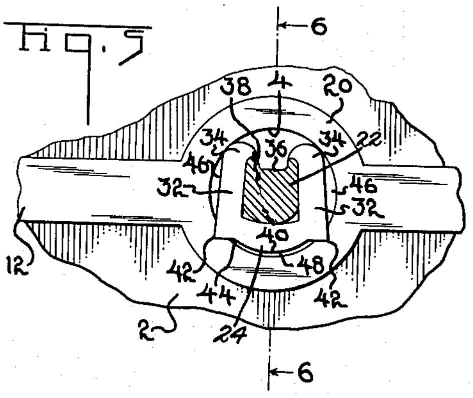
FIGURE 5 is a fragmentary sectional plan view illustrating the mounting of the tipped lead of FIGURES 3 and 4 in an aperture of a printed circuit board.
Figure 3:
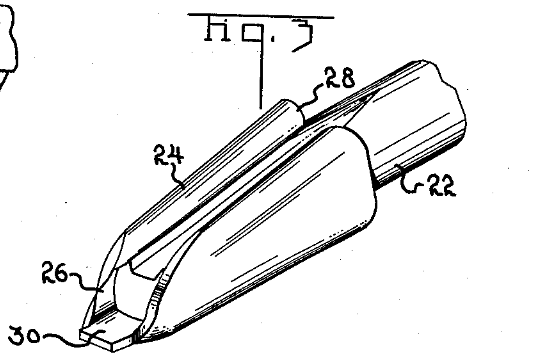
FIGURES 3 and 4 are enlarged perspective views of the end portion of an electrical component lead tipped in accordance with one embodiment of the present invention.

The composite lead end structure, as shown in FIGURE 5, presents at the top surface of base plate 2 approximately a square configuration, adapter 24 being generally U-shaped and defining a trough in which lead end 22 is disposed. Sidewalls 32 of the U compress lead end 22 therebetween and converge slightly, at an angle of 6° for example, toward their ends 34 which are curved inwardly and slightly downwardly trapping lead end 22 in the trough. A substantial gap remains between ends 34, which, with a longitudinal indentation 36 in lead end 22, forms a groove and a primary capillary passage 38 for the flow of solder. The base of the U is centrally convex at 40, but sharply reentrant adjacent side edges 42 to provide corners and secondary capillary passages 44 for the flow of solder. Sidewall ends 34 and edges 42 forcefully bear against the aperture sidewalls and maintain the tipped lead stable in the aperture. It will also be observed in the case of the present illustrative form that void spaces, or gaps 46 and 48 between the aperture sidewalls and sidewalls 32 and convexity 40 of adapter 24 remain after insertion of the tipped lead. To form the desired continuous fillets 14, solder must bridge these gaps in a structure sufficiently stable to remain on lifting the printed circuit board out of the solder bath. It has been found that if the radial extent of gaps 46 and 48 does not exceed, in general, a maximum distance of the order of 0.010 inch, a sufficient amount of solder in the fillet to form a stable bridge can be accumulated on pad 20 with the time allotted.

In the solder-dip operation, the time in which the printed circuit board may remain in contact with the molten solder in the solder bath is short and measured in terms of seconds because the heat of the bath adversely affects the board at prolonged contact or may be transmitted via the component leads to the component body, typically a heat-sensitive diode, or transistor, etc. Preferably, therefore, capillary passages 38 and 44 are approximately equally spaced, as shown, so that solder-dipping base plate 2, solder will rise at spaced points from which to spread quickly around pad 20 to form fillet 14. It will be appreciated, of course, that the various capillary passages may not have equal solder lifting capacities. Substantially all of the solder which, in a given case, spreads around pad 20 may have risen through one passageway, such as 38 in the present embodiment, which has been shaped for particular lifting efficiency. Other passageways, typically as shown by passageways 44 in the present form, may serve to induce solder into spaces within the two faces of the board between the tip and the sidewalls of the board aperture which spaces otherwise could be filled, if at all, only by overflow of excess solder from pad 20 lifted by capillary 38. Thus, with this form of the invention, there has been provided a structure inherently well suited for connection to a variety of leads and mechanically stable when inserted into board apertures through the wide range of diameter tolerances which are found in commercial runs of boards of this character. At the same time the capacities of the several capillary passageways are such that continuous and solid solder fillets 14 at pads 20 can consistently be formed within time limits which assure full protection to board components from adverse heating effects of over exposure to the solder bath.

Figure 6:
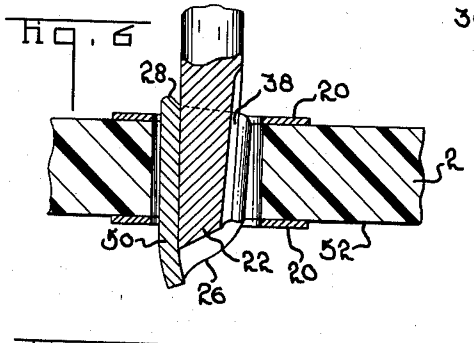
FIGURE 6 is a sectional view taken along lines 6—6 of FIGURE 5.
Figure 4:
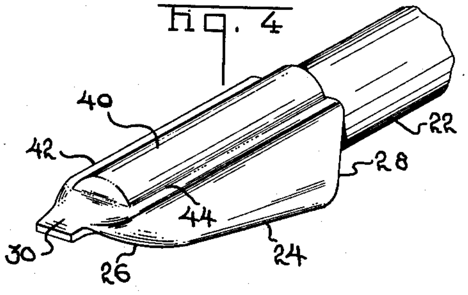

In this connection it is known that surfaces to be soldered preferably are heated. Advantageously, therefore, a part 50, of the order of 1/32 inch, of the tipped lead extends, as best shown in FIGURES 2 and 6, below the under surface 52 of base 2 and directly into the molten solder of bath 16. Projecting part 50 is thus directly heated and serves as a heat transmitter for direct conduction to the remainder of the tipped lead. Further, sharp edges 42 significantly score the aperture sidewalls and pad 20, FIGURE 5, to provide a continuous heat conductive path from bath 16 to strip 12.

With a lead tip thus formed, continuous fillets have been obtained with a solder dip time of approximately 5 seconds and a bath temperature of about 480° F.

Figure 8:
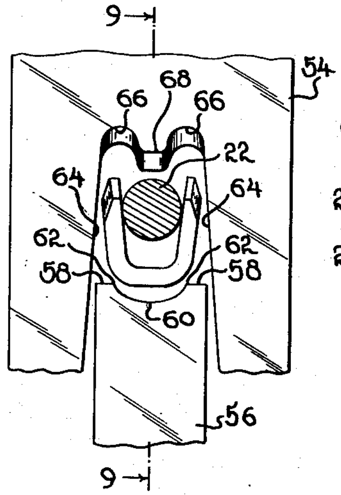
FIGURE 8 is a fragmentary view in front elevation of a pair of crimping dies with an adapter and a component lead disposed therebetween in position to be crimped.
Figure 9:
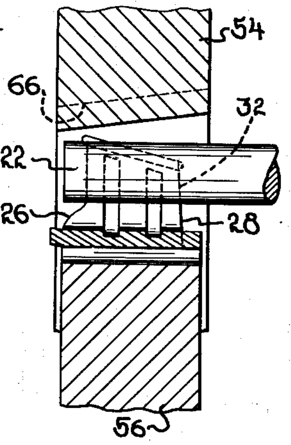
FIGURE 9 is a sectional view taken along lines 9—9 of FIGURE 8.
Figure 10:
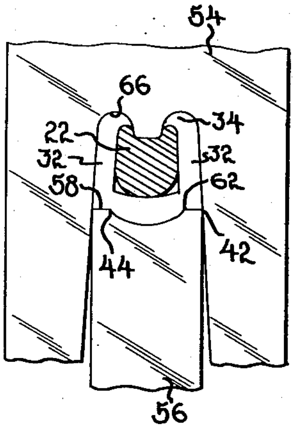
FIGURE 10 is a view similar to FIGURE 8 illustrating the relation between the dies and the tipped lead after the dies have been closed.

The die apparatus, FIGURES 8 to 10, for crimping adapter 24 to lead end 22 includes an upper crimping die 54 which is moved toward and away from a lower die or anvil 56 by press apparatus, not shown, conventional and well-known in the art. The cavity defined by the working faces when the dies are closed determines, in general, the transverse configuration of the composite lead end structure, and thus anvil 56 in the present form has flat marginal edges 58 and a central longitudinal groove 60 providing therebetween indenting edges 62 for forming reentrant corners 44. Sidewalls 64 of upper die 54 converge and merge smoothly into cylindrical curling surfaces 66 for turning ends 34 inwardly as described. A central, longitudinally extending indenter 68 between surfaces 66 effects the formation of capillary passage 38. The press apparatus including dies 54 and 56 may be automatic in operation, and further includes automatic feed apparatus whereby a plurality of adapters 24, FIGURE 7, joined together in a continuous strip are fed seriatim into crimping position when the dies are open, FIGURE 8, closure of the dies, FIGURE 10, effecting the crimp while the leading adapter is separated from the strip, all as is conventional in the art.

To impart the desired wedge-shaped or longitudinal taper to the tipped lead, the faces 60, 62, 66 and 68 of the dies have a longitudinal convergence as shown in FIGURE 9. It is, however, to be understood that the dies are closed to a constant crimp height to match a given size standard aperture whereby the angle of convergence is set, relative to the length of the adapter, so that the smallest diameter wire employed will just be sufficiently gripped at end 26, FIGURE 3, to support component 10 on the circuit board. For larger wire diameters more or less of the metal of the wire will be extruded rearwardly, due to crimping on a taper, to fill more or less of the adapter trough at rearward end 28, thus to accommodate the desired range of wire sizes.

Figure 11:
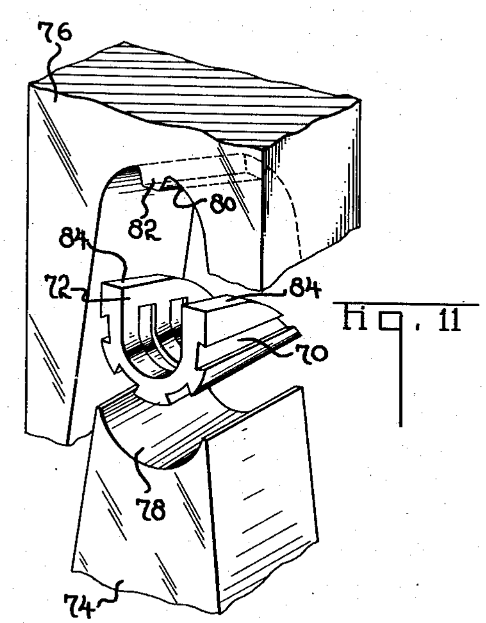
FIGURE 11 is a fragmentary perspective view illustrating an adapter for forming a tipped lead in accordance with another embodiment of the present invention, the adapter disposed in position to be crimped between crimping dies.
Figure 12:
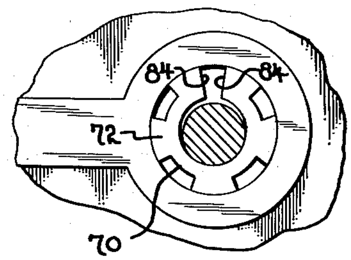
FIGURE 12 is a fragmentary sectional plan view illustrating the mounting in an aperture of a printed circuit board a tipped lead formed as indicated in FIGURE 11.

In an alternative embodiment, FIGURES 11 and 12, the desired peripherally spaced capillary passages may be formed as longitudinal serrations or grooves 70 in the manufacture of the pre-formed adapter 72, the associated die apparatus providing only for wrapping on a taper the adapter sidewalls around the inserted component lead. Thus, lower die 74 and upper die 76 have die faces 78 and 80 which define, when closed, a circular cavity at one end of a diameter slightly larger than the aperture diameter, and converging toward the other end to effect the tapered crimp. A longitudinal ridge 82 may be provided, if desired, to prevent end edges 84 of the adapter from meeting in the crimp whereby to expose the adapter interior accessible to solder as shown in FIGURE 12.

Changes in construction will occur to those skilled in the art and various apparently different modifications and embodiments may be made without departing from the scope of the invention. The matter set forth in the foregoing description and accompanying drawings is offered by way of illustration only. It is to be understood, however, that the embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

We claim:

1. A tipped component lead adapted to be inserted and wedged in an unplated aperture of a printed circuit board for promoting the capillary rise of solder therein in a solder-dip operation, which tipped lead comprises a metallic adapter member disposed about the end portion of a component lead, said adapter member including a bottom portion and a pair of sidewalls extending upwardly from opposed sides of said bottom portion to define a channel for receiving said lead end portion, the ends of said sidewalls being spaced to define therebetween a groove extending along the length of the tipped lead, said tipped lead being wedge-shaped and tapering toward the insertion end thereof from a maximum lateral dimension at least as great as the diameter of the aperture, said bottom portion having a convex transverse curvature to reduce, at the rearward end of the tipped lead when so wedged, the radial spacing thereof from the edge of said aperture to less than about 0.010 inch.

2. A tipped component lead adapted to be inserted and wedged in an unplated aperture of a printed circuit board for promoting the capillary rise of solder therein in a solder-dip operation, which tipped lead comprises a metallic adapter member disposed about the end portion of a component lead, said adapter member including a bottom portion and a pair of sidewalls extending upwardly from opposed sides of said bottom portion to define a channel for receiving said lead end portion, the ends of said sidewalls being spaced to define therebetween a groove extending along the length of the tipped lead, said tipped lead being wedge-shaped and tapering toward the insertion end thereof from a maximum lateral dimension at least as great as the diameter of the aperture, the channel bottom portion being substantially flat along its marginal edges and having a convex transverse curvature between said marginal edges.

3. A tipped component lead adapted to be inserted and wedged in an unplated aperture of a printed circuit board for promoting the capillary rise of solder therein in a solder-dip operation, which tipped lead comprises a metallic adapter member disposed about the end portion of a component lead, said adapter member including a bottom portion and a pair of sidewalls extending upwardly from opposed sides of said bottom portion to define a channel for receiving said lead end portion, the ends of said sidewalls being turned inwardly and downwardly to confine and grip at least the end of said lead end portion within said member, said sidewall ends being spaced to define therebetween a groove extending along the length of the tipped lead, said sidewalls decreasing in height relative to said bottom portion to impart a wedge-shape to the tipped lead tapering toward the insertion end thereof, the maximum lateral dimension of said tipped lead being at least as great as the diameter of the aperture, the channel bottom portion having longitudinal indentations adjacent its marginal edges and a convex transverse curvature between said indentations.

4. For use in solder-dip connecting electrical components to printed circuit boards, a printed circuit board having an unplated aperture, a metallic pad surrounding the aperture on one surface of said board, a tipped component lead inserted and wedged in the aperture in contact with the pad, which tipped lead comprises a metallic ferrule cold-forged about and gripping the end of the component lead to form therewith a composite tip tapering toward the insertion end thereof, the ferrule including a bottom web connecting with sidewall portions at sharp angled corners to define longitudinal edges for biting into the metallic pad for conducting heat from a solder bath to the pad, said sidewall portions being inwardly bent toward one another but spaced to define a groove therebetween linearly extending along the tip, a plurality of grooves in said web adjacent said corners, said grooves linearly extending along at least the portion of said tip disposed within the thickness of said board and defining capillary passages for inducing the flow of solder along the tip and onto the pad.

References Cited in the file of this patent

UNITED STATES PATENTS

| | | |
|---|---|---|
| 1,759,043 | Derby | May 20, 1930 |
| 1,786,369 | Terrell et al. | Dec. 23, 1930 |
| 2,031,378 | Lormer | Feb. 18, 1936 |
| 2,165,323 | White | July 11, 1939 |
| 2,707,272 | Blitz | Apr. 26, 1955 |
| 2,772,323 | Smith | Nov. 27, 1956 |
| 2,866,171 | Wagner et al. | Dec. 23, 1958 |
| 2,902,629 | Little et al. | Sept. 1, 1959 |

FOREIGN PATENTS

| | | |
|---|---|---|
| 1,154,541 | France | Nov. 4, 1957 |